United States Patent [19]
Ohzone et al.

[11] Patent Number: 5,250,455
[45] Date of Patent: Oct. 5, 1993

[54] METHOD OF MAKING A NONVOLATILE SEMICONDUCTOR MEMORY DEVICE BY IMPLANTING INTO THE GATE INSULATING FILM

[75] Inventors: Takashi Ohzone; Takashi Hori, both of Osaka, Japan

[73] Assignee: Matsushita Electric Industrial Co., Ltd., Japan

[21] Appl. No.: 899,584

[22] Filed: Jun. 18, 1992

Related U.S. Application Data

[60] Continuation of Ser. No. 659,762, Feb. 25, 1991, abandoned, which is a division of Ser. No. 506,610, Apr. 10, 1990, abandoned.

[51] Int. Cl.⁵ .................................... H01L 21/266
[52] U.S. Cl. ............................ 437/43; 437/24; 437/37; 437/941
[58] Field of Search .............. 437/24, 37, 43, 941, 437/959; 357/23.5; 148/DIG. 34, DIG. 76, DIG. 82, DIG. 83

[56] References Cited

U.S. PATENT DOCUMENTS

| | | | |
|---|---|---|---|
| 3,328,210 | 6/1967 | McCaldin et al. | 437/37 |
| 3,649,884 | 3/1972 | Haneta | 437/941 |
| 4,043,024 | 8/1977 | Iwamatsu | 437/37 |
| 4,297,782 | 11/1981 | Ito | 437/37 |
| 4,466,839 | 8/1984 | Dathe et al. | 437/918 |
| 4,717,943 | 1/1988 | Wolf et al. | 357/23.5 |
| 4,868,618 | 9/1989 | Kalnitsky et al. | 357/23.5 |
| 4,978,631 | 12/1990 | Blanchard | 437/24 |

OTHER PUBLICATIONS

Kalnitsky et al, "Memory Effect and Enhanced Conductivity in Si-Implanted Thermally Grown S1O₂", IEEE Transactions on Electron Devices, vol. ED-34, No. 11 (Nov. 1987), pp. 2372-2373.

Primary Examiner—Brian E. Hearn
Assistant Examiner—C. Chaudhari
Attorney, Agent, or Firm—Lowe, Price, LeBlanc & Becker

[57] ABSTRACT

A nonvolatile semiconductor memory comprising a silicon semiconductor substrate and formed thereon a gate insulating film, wherein an ion belonging to the same Group IV in the periodic table as the ion of said silicon semiconductor substrate belongs is shot into said gate insulating film by ion implantation in a dose of not less than $10^{16}$ cm$^{-2}$ to form an ion-implanted region therein in such a way that a peak of impurity density of the ion is present at the gate insulating film side from the interface between said semiconductor substrate and said gate insulating film.

Also disclosed are an MOS integrated circuit comprising the nonvolatile semiconductor memory, and a method of making the nonvolatile semiconductor memory.

3 Claims, 9 Drawing Sheets

METHOD OF MAKING A NONVOLATILE SEMICONDUCTOR MEMORY DEVICE BY IMPLANTING INTO THE GATE INSULATING FILM

This application is a continuation; application of application Ser. No. 07/659,762, filed Feb. 25, 1991, now abandoned, which is a divisional application of application Ser. No. 07/506,610, now abandoned, filed Apr. 10, 1990.

BACKGROUND OF THE INVENTION

1. Field of the Invention

This invention relates to a semiconductor memory. More particularly, it relates to a nonvolatile semiconductor memory in which the amount of electric charge controlled by injecting or releasing electric charge in or from a gate insulating film can be retained for a relatively long time even after turn-off of a controlling means, thus having nonvolatile memory effect.

2. Description of the Prior Art

Figure 8A:
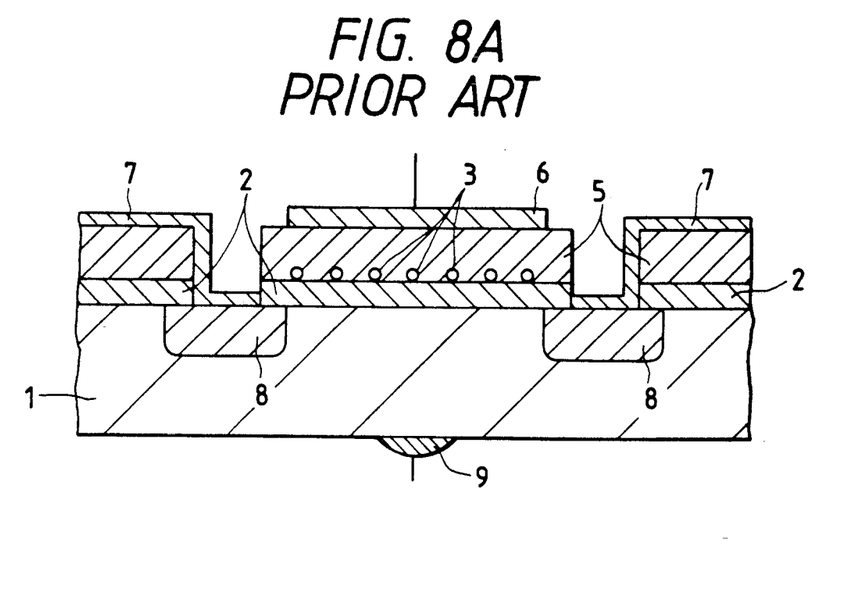
FIG. 8 cross-sectionally illustrates the constitution of a conventional nonvolatile semiconductor memory.
Figure 8B:
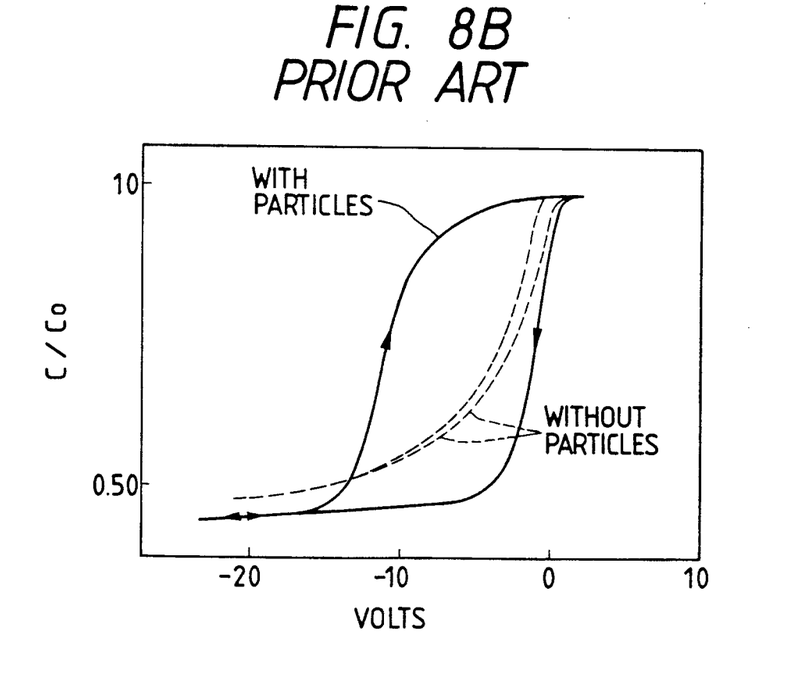
FIG. 8B is a graph to show the hysteresis characteristics thereof.

FIG. 8A illustrates an example of a prior art nonvolatile MIS transistor (Japanese Laid-open Patent Application No. 47-6921 of Apr. 15, 1972). An about 3 nm thick $SiO_2$ film 2 that enables injection and release of electric charge, attributable to tunnel effect, is formed at the top surface of a semiconductor substrate 1, and a plurality of particles 3 with a size of about 3 nm which are scatteringly provided so as to undergo no mutual action (comprising, for example, a semiconductor or a metallic material, specifically including refractory metals such as Mo, and noble metals such as Pt and Ag) are formed by vacuum deposition or the like. Next, an $SiO_2$ film, $Si_3N_4$ film or $Al_2O_3$ film 5 with a thickness of as relatively large as about 75 nm is formed by CVD or the like. The numeral 6 denotes a gate electrode, and 8, a source region or a drain region. The numeral 7 denotes metallic wiring that forms an ohmic contact between the source regions or drain regions, and 9, a substrate contact to the semiconductor substrate 1. As an example in which the insulating films 2 and 5 are formed into a single layer film using the same material, the above Japanese Laid-open Patent Application No. 47-6921 discloses an instance in which metal or semiconductor ions ($In^+$ and $Nb^+$ are exemplified as suitable ion species) are shot into the interior by ion implantation. This Japanese Laid-open Patent Application No. 47-6921 discloses an example of measurement for an actual nonvolatile memory effect as shown in FIG. 8B. In FIG. 8B, the capacity ratio $C/C_O$, standardized to the capacity $C_O$ of an insulating film, is indicated as a function of an applied voltage on the gate electrode 6. This actual measurement example is concerned with a gate electrode with two-layer structure comprised of a 25 nm thick $SiO_2$ film 2 and a 75 nm thick $Al_2O_3$ film 5, where the particles 3 comprise Pt particles with a nominal size of 3.5 nm, formed by vacuum deposition, when the particles 3 are present, a great hysteresis effect is observed as shown by solid lines. On the other hand, when no particles are present, little hysteresis effect is observed as shown in dotted lines. There, however, is no disclosure as to any example of actual measurement for an instance in which the particles are formed by ion implantation, and it can not be conjectured that a test sample has been prepared. Even if It is conceived that the $In^+$ or $Nb^+$ ions exemplified in Japanese Laid-open Patent Application No. 47-6921 are implanted in the vicinity of the interface between the insulating films, it is presumed that the implanted ions go through the insulating film and are implanted in the Si substrate, so that the $In^+$ or $Nb^+$ ions behave as impurities of Group III or Group V ions, respectively, and a great change is caused in the threshold voltage of the MIS transistor.

More specifically, as in the prior art, ions are implanted under Gaussian distribution in order to implant ions so as to have a peak density in the vicinity of about 3 nm from the Si substrate and to give an amount of implantation of approximately from $10^{16}$ to $10^{17}$ cm$^{-2}$, so that ions go through an insulating film of about 3 nm thick and implanted in the Si substrate in a dose of approximately from $10^{14}$ to $10^{16}$ cm$^{-2}$. Thus, the implantation of a large quantity of Group III or Group V impurities in the Si substrate is presumed to cause a very great change in the threshold voltage, which is as great as several volts or more, thus making it impossible to control the threshold voltage (approximately from 0.5 V to 1.0 V in usual instances) of the MIS transistor. In other words, since the dose of the impurities of Group III or Group V ions, used for controlling of the threshold voltage Of the MIS transistor is approximately from $10^{12}$ to $10^{13}$ cm$^{-2}$. it therefore becomes impossible to control the threshold voltage when the $In^+$ or $Nb^+$ ions are in a larger dose by the factor of one figure to three figures Moreover, even if it is attempted to form the peak of ion implantation impurity distribution at the position of about 3 nm from the Si substrate, the non-uniformity of dose of the $In^+$ or $Nb^+$ ions implanted in the Si substrate is very great when the non-uniformity of the gate electrode or ion implantation energy is taken into account, and also the change in the threshold voltage, caused by $In$ or $Nb^+$ ions, is great. Thus, it becomes impossible to control the threshold voltage of the MIS transistor.

As discussed in the above, the method of forming the particles 3 by the ion implantation conceivable from the prior art can not control the threshold voltage of the MIS transistor, and hence can not be worked as a method of providing a nonvolatile semiconductor memory.

SUMMARY OF THE INVENTION

Accordingly, an object of the present invention is to provide, by the use of ion implantation, a nonvolatile semiconductor memory that enables control of the threshold voltage of an MIS transistor and has a sufficiently large hysteresis, and a method of making the same.

The present invention is characterized in that an ion belonging to the same Group IV in the periodic table (such as $Si^+$, $Ge^+$, $Sn^+$ and $Pb^+$) as the ion of an Si semiconductor substrate belongs is implanted as an ion implantation impurity in a dose of not less than $10^{16}$ cm$^{31\ 2}$.

The present invention, which takes the above constitution, can materialize a nonvolatile semiconductor memory that may contribute no changes in the threshold voltage because of ions that are not activated even when the Group IV ions to be implanted in a gate insulating film are implanted in the Si substrate under Gaussian distribution with its skirt trailed along, and also has a hysteresis well large enough to endure actual use

DESCRIPTION OF THE PREFERRED EMBODIMENTS

Figure 1A:
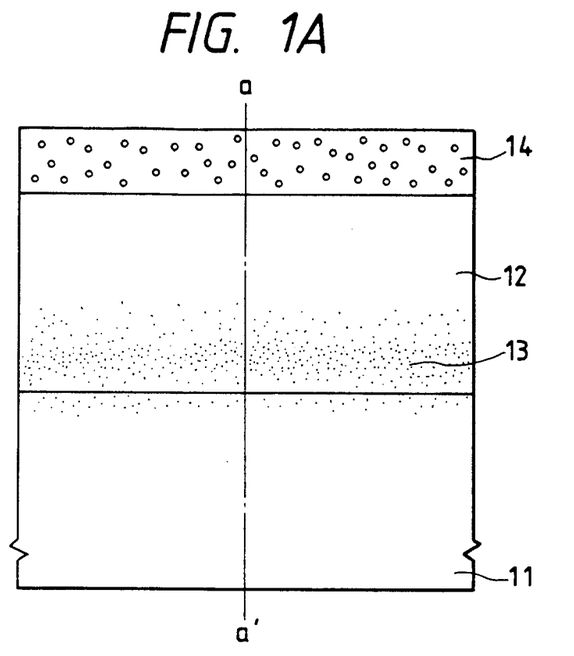
FIGS. 1A and 1B are views to explain a concept of a gate structure having a nonvolatile memory effect, according to the present invention.
Figure 1B:
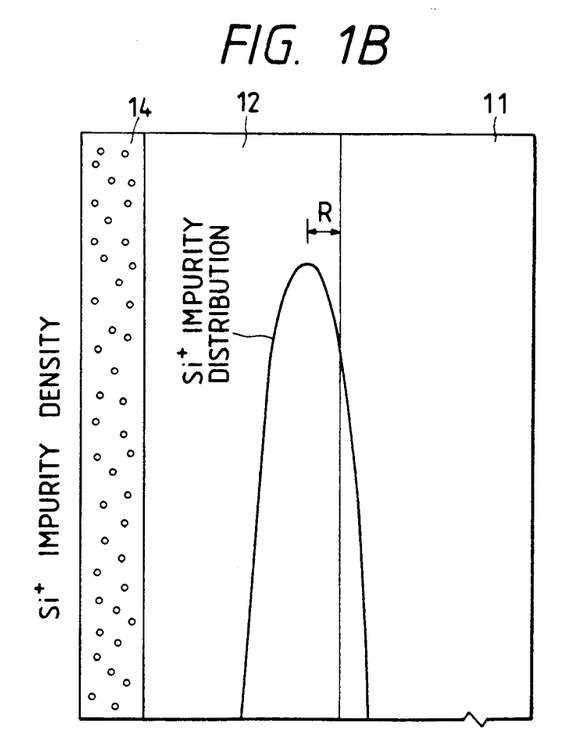
Figure 2A:
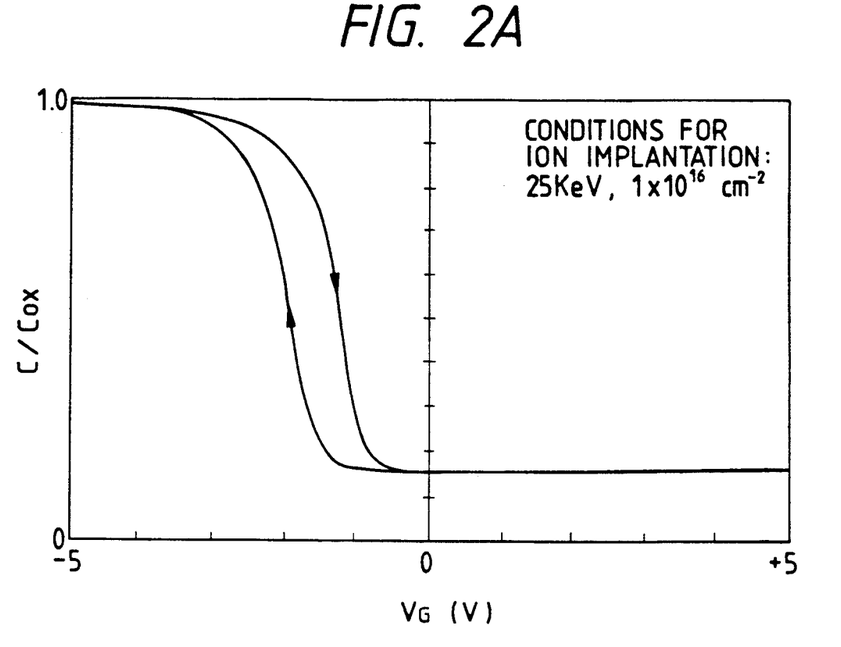
FIGS. 2A and 2B are graphs to show hysteresis characteristics in actual measurement data showing a nonvolatile memory effect of a gate insulating film.
Figure 2B:
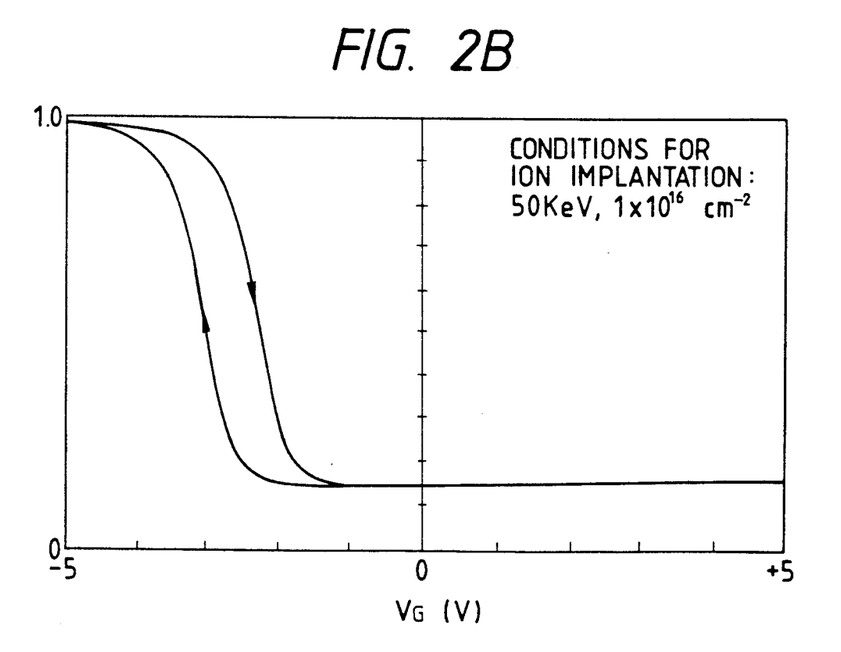

FIGS. 1A and 1B illustrate an example of the present invention. FIG. 1A cross-sectionally illustrate the constitution of a gate region of an MIS transistor, and FIG. 1B illustrate the distribution of impurity density of ion-implanted $Si^+$ions, at a cross section along the line a—a' in FIG. 1A. On the top surface of a p-type Si substrate 11 with a specific resistance of about $10\Omega.cm$, a 50 nm thick $SiO_2$ film 12 is formed as a gate insulating film. $Si^+$ions are implanted therein at 25 keV or 50 keV in a dose of from $10^{13}$ to $10^{16}$ cm$^{-2}$ to form an $Si^+$-ion-implanted region 13. Thereafter, a polycrystalline Si film 14 is formed as a gate electrode. Here, distance R shown in FIG. 1B (i.e., the distance from the interface between the Si substrate 11 and the $SiO_2$ film 12, to a peak position of the distribution of impurity density of $Si^+$ions) is about 25 nm when ions are implanted at 25 keV, and about 0 nm, at 50 keV. FIGS. 2A and 2B show the dependence of a capacity change ratio ($C/C_{OX}$, wherein $C_{OX}$ represents a maximum capacity value at an accumulation region) of gate capacity, on a gate voltage $V_G$ applied to the gate electrode, in the case when $Si^+$ions are implanted in a dose of $1 \times 10^{16}$ cm$^{-2}$ and at an implantation energy of 25 keV (FIG. 2A) or 50 keV (FIG. 2B) Hysteresis is observed in the sweep range that $V_G$ is +5 V, giving about 1 V as its window width (amount of change $\Delta V_T$ of the threshold voltage of an MIS transistor). In the case of a dose of $10^{15}$ $cm^{-2}$, the window width of the hysteresis is not more than 0.1 V in the sweep range of +5 V. In the case of a dose of from $10^{13}$ to $10^{14}$ cm$^{-2}$, no hysteresis phenomenon is observed. In the case when ions are implanted in the dose of $1 \times 10^{16}$ cm$^{-2}$ the peak impurity densities of Si ions are about $4.4 \times 10^{21}$ cm$^{-3}$ and about $8.0 \times 10^{21}$ cm$^{-3}$ at 50 keV and 25 keV, respectively, and changes of a flat-band electrode $V_{FB}$ are 1.9 V and 0.8 V, respectively, in spite of the $Si^+$ions implanted in the Si substrate in a high density. In the case of implantation at 50 keV at which the peak of impurity density is presumed to be present at the $Si$-$SiO_2$ interface, the $V_{FB}$ change does not exceed 1.9 V. This indicates that greater part of the ions implanted in the dose of $10^{16}$ cm$^{-2}$ are inactive and do not contribute the change in $V_{FB}$, since a theoretical calculation allows a presumption that the $Si^+$ions have been activated only for the ions implanted in the Si substrate in an amount of about $10^{12}$ cm$^{-2}$. The validity for the use of $Si^+$ions as in the present invention is thus established. This also corresponds to the fact that there is no change in $V_{FB}$ when $Si^+$ions are implanted in a dose of $10^{15}$ cm$^{-2}$ or less at 50 keV or 25 keV, and thus the $Si^+$ions of about $10^{15}$ cm$^{-2}$ or so are inactive in the Si substrate.

Figure 3A:
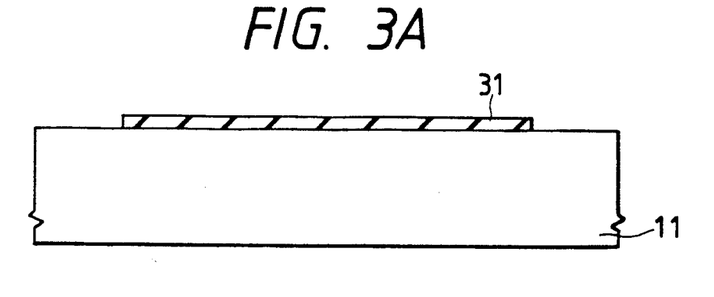
FIGS. 3A to 3D cross-sectionally illustrate a process for the formation of a nonvolatile MOS (metaloxide-semiconductor) memory transistor.
Figure 3B:
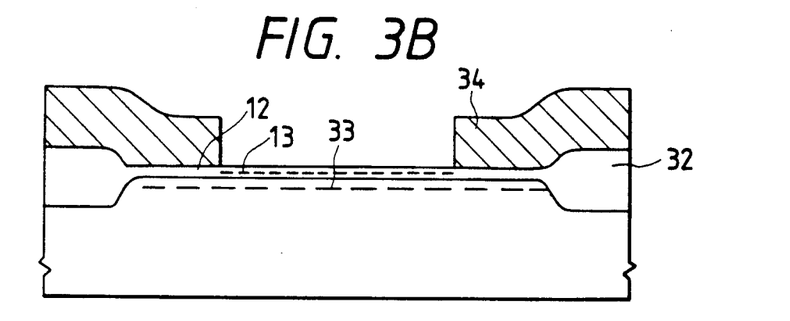
Figure 3C:
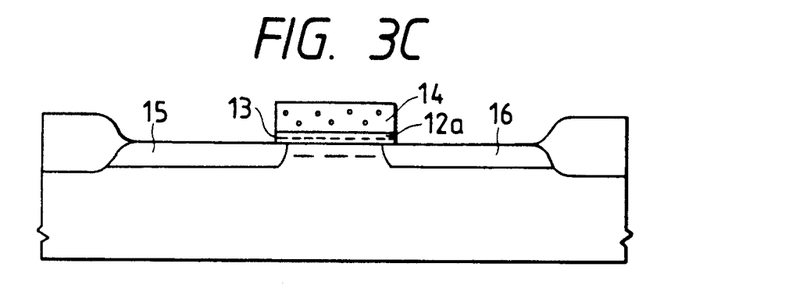
Figure 3D:
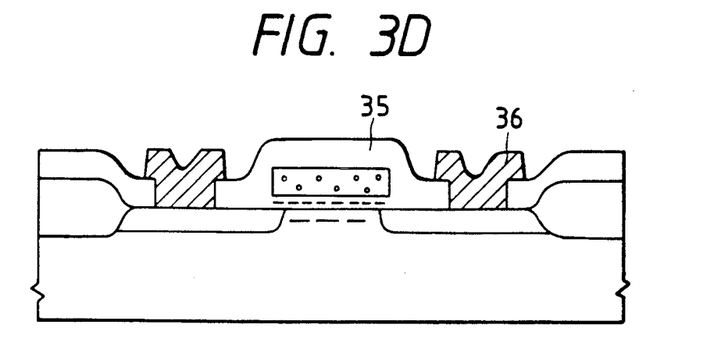

Since the hysteresis phenomenon in the gate insulating film has been proved, an MOS transistor was then actually manufactured as an experiment, as reported below. FIGS. 3A to 3C illustrate a process of the experimental manufacture, and FIG. 3D illustrates a crossectional structure of the transistor thus manufactured.

On a p-type Si substrate 11 of about 10 $\Omega$cm, an $Si_3N_4$ film 31 is selectively formed (FIG. 3A). Using the resulting $Si_3N_4$ film 31 as a mask, a field oxide film 32 is formed, and then the $Si_3N_4$ film 31 is removed (this step is called the LOCOS process). A $B^+$ion-implanted region 33 for controlling the threshold voltage ($V_T$) of the MOS transistor is formed at an implantation energy of 40 keV and in a dose ranging from $4 \times 10^{11}$ to $10 \times 10^{11}$ cm$^{-2}$. Next, as a gate oxide film, an $SiO_2$ film 12 is formed with a thickness of 50 nm on the Si substrate 11. A photoresist film 34 is optionally formed, and $Si^+$ions are selectively implanted in the $SiO_2$ film 12 at an implantation energy of 25 keV or 50 keV in a dose of from $10^{15}$ to $3 \times 10^{16}$ cm$^{-2}$. An $Si^+$ion-implanted region 13 is thus formed (FIG. 3B). After removal of the photoresist film 34, an n polycrystalline $Si^+$film which contains phosphorus in a high concentration is formed with a thickness of about 350 nm on the whole surface, and a gate electrode 14 and a gate insulating film 12a are selectively formed using a conventional photoetching technique. Thereafter, in the same manner as a process for the manufacture of a conventional Si gate MOS transistor, $As^+$ions are implanted at 80 keV in a dose of $6 \times 10^{15}$ cm$^{-2}$ using the polycrystalline Si film 14 as a mask for ion implantation, and thus $n^+$-diffused regions serving as a source region 15 and a drain region 16 are thus formed. In this instance, a heat treatment for annealing the $Si^+$ion-implanted region 13 in the gate $SiO_2$ film 12a and the above $n^+$-diffused regions 15 and 16 are carried out at 900° C. for about 30 minutes (FIG. 3C). Next, as an interlayer insulating film, an interlayer $SiO_2$ film 35 is formed with a thickness of about 0.8 $\mu$m. Contact openings are selectively formed, and aluminum electrodes 36 are formed, thus forming terminals to the source and drain regions or the gate electrode (FIG. 3D)

Figure 4A:
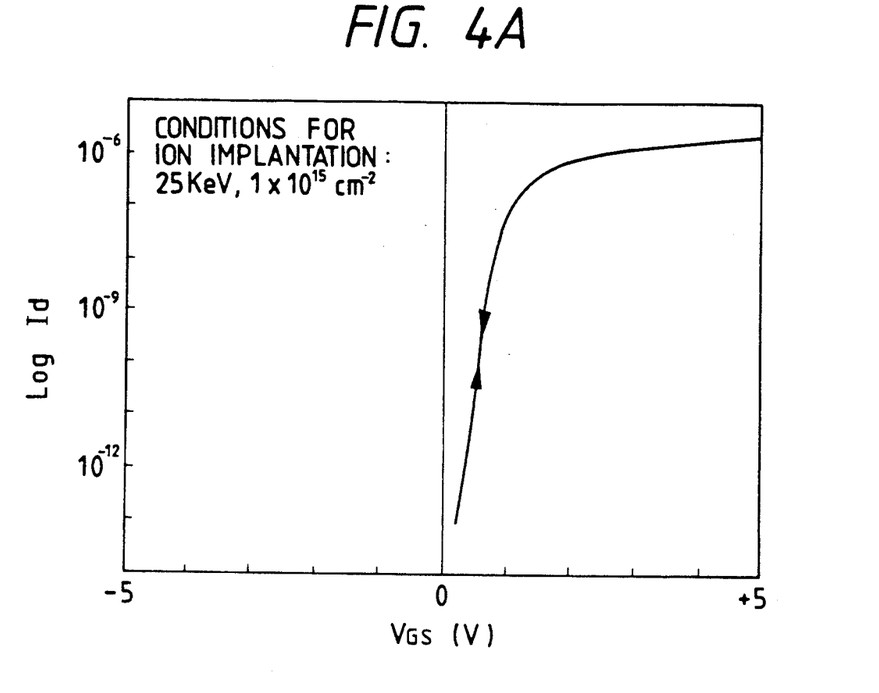
FIGS. 4A to 4D and FIG. 5 are graphs to show hysteresis characteristics in actual measurement data showing a nonvolatile memory effect of an MOS transistor according the present invention.
Figure 4B:
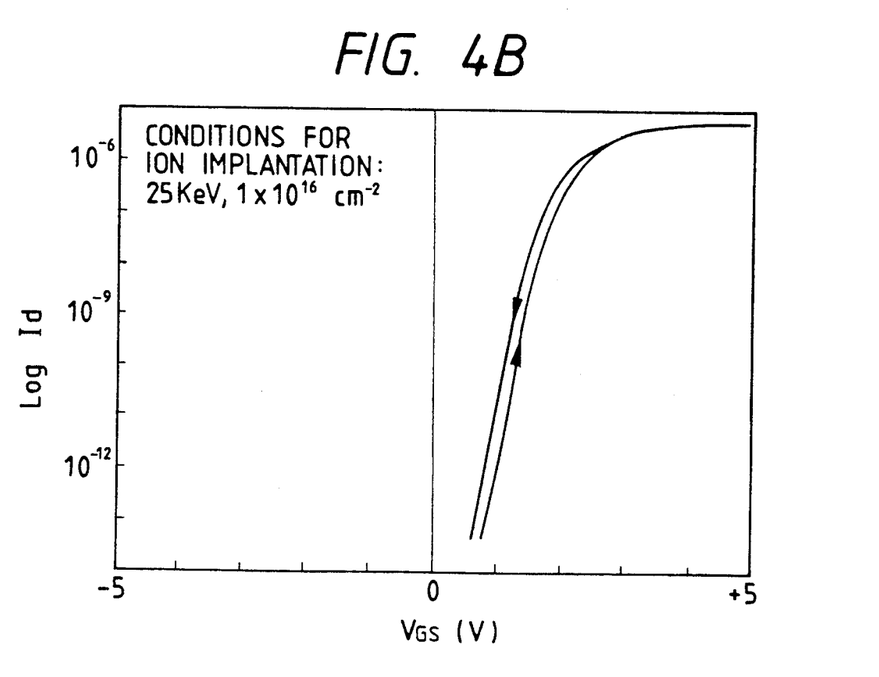
Figure 4C:
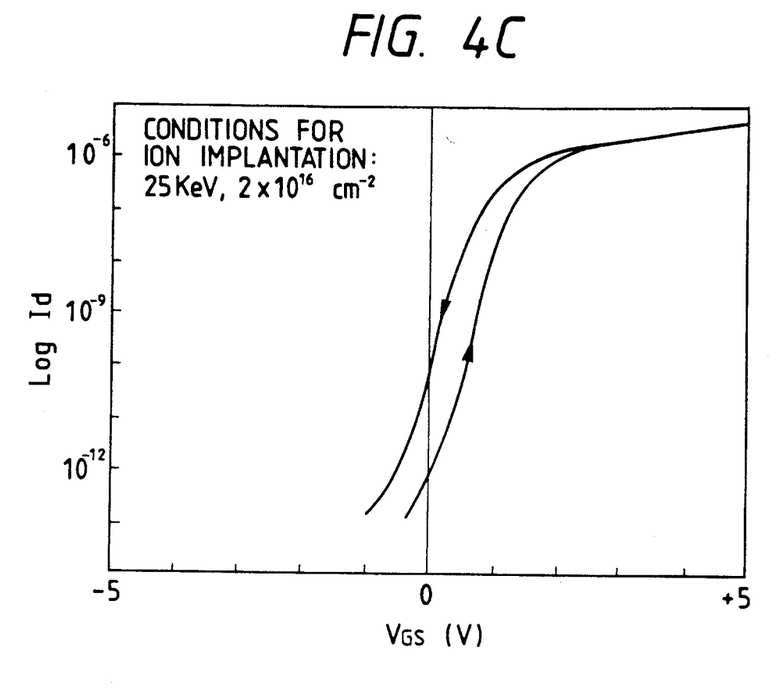
Figure 4D:
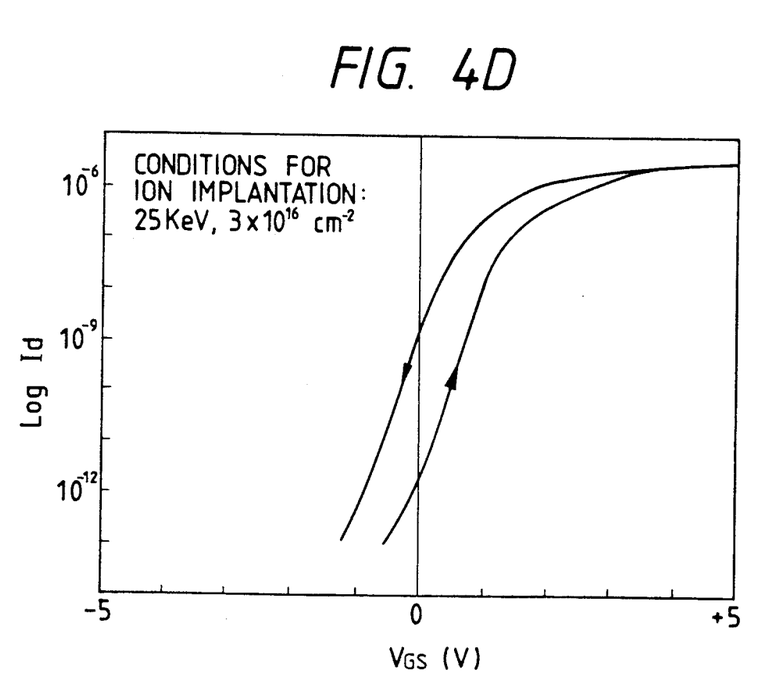
Figure 5:
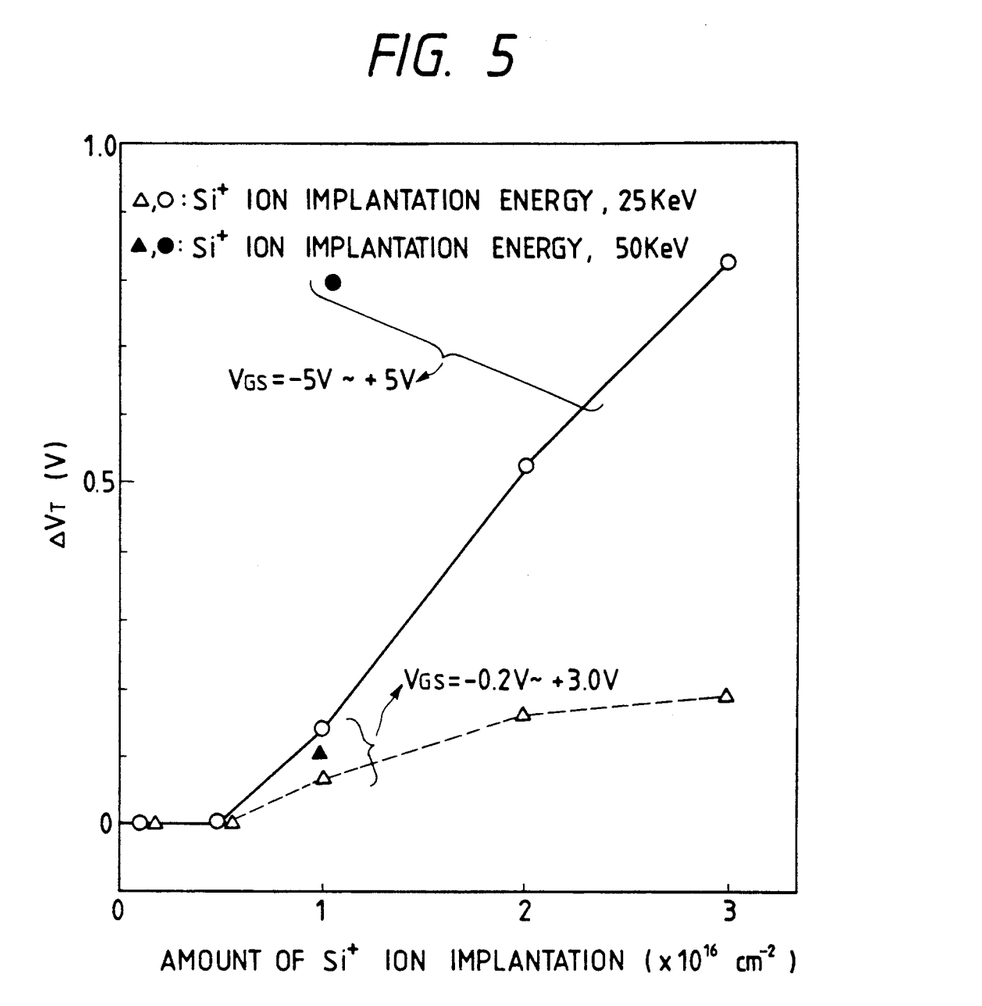

FIGS. 4A to 4D show characteristics of a drain current Id to a gate-to-source voltage $V_{GS}$ of the MOS transistor when the $Si^+$ion-implanted region 13 is formed under conditions of an implantation energy of 25 keV and in a dose of $1 \times 10^{15}$ cm$^{-2}$ (FIG. 4A), $1 \times 10^{16}$ cm$^{-2}$ (FIG. 4B), $2 \times 10^{16}$ cm $^{-2}$ (FIG. 4C) or $3 \times 10^{16}$ cm$^{-2}$ (FIG. 4D). In FIGS. 4A to 4D, the Id is plotted as ordinate in logarithmic scale. The threshold voltage $V_T$ is about 1.0 V, and is substantially constant without regard to the amount of implantation of $Si^+$ions. The voltage $V_{SD}$ between source and drain is 0.1 V. and the substrate bias voltage is 0 V. The gate voltage $V_{GS}$ is in a sweep amplitude of $\pm 5$ V. No hysteresis phenomenon is observed when the $Si^+$ions are implanted in a dose of $1 \times 10^{15}$ cm$^{-2}$, but it begins to be observed when implanted in a dose of $1 \times 10^{16}$ cm$^{-2}$, and the window width of the hysteresis increases with an increase in the dose of implantation. FIG. 5 shows the relationship between the window width of the hysteresis and the dose of Si+ion implantation. The marks of a triangle and a circle and the marks of a solid triangle and a solid circle indicate data obtained when the ions are implanted at an energy of 25 keV and 50 keV, respectively. The marks of a triangle and solid triangle and the marks of a circle and a solid circle indicate the cases in which the $V_{GS}$ is in the range of from $-0.2$ V to $+3.0$ V, or $-5$ V to $+5$ V, respectively. When the $V_{GS}$ is in an amplitude of $\pm 5$ V, and $\Delta V_T$ increases substantially in proportion to the amount of Si+ion implantation in the case of 25 keV. When the $V_{GS}$ is in an amplitude of $-0.2$ V to $+3.0$ V and from $-5$ V to 5 V, up to 0.2 V of $\Delta V_T$ is obtained at a dose of $3 \times 10^{16}$ cm$^{-2}$, respectively. While $\Delta V_T$ are 0.05 V at a dose of $1 \times 10^{16}$ cm$^{-2}$, respectively. IN the case of 50 keV, up to 0.8 V of the $\Delta V_T$ value is obtained in the $V_{GS}$ amplitude of from $-5$ V to $+5$ V and up to 0.1 V of the $\Delta V_T$ value is obtained in the $V_{GS}$ amplitude of from $-0.2$ V to $+3.0$ V, when the ions are in a dose of $1 \times 10^{16}$ cm$^{-2}$. Because of the presence of a peak impurity density at the Si-SiO$_2$ interface, a large $\Delta V_T$ value is presumed to have been obtained at a small dose in the case of 50 keV, and it has been found that such Si+ions cause the hysteresis.

Figure 6A:
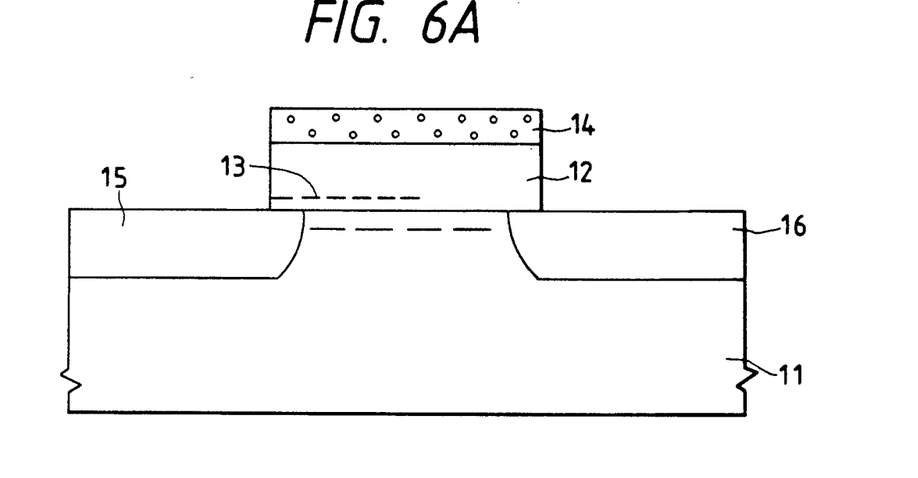
FIGS. 6A and 6B cross-sectionally illustrate the constitution of another example of the present invention.
Figure 6B:
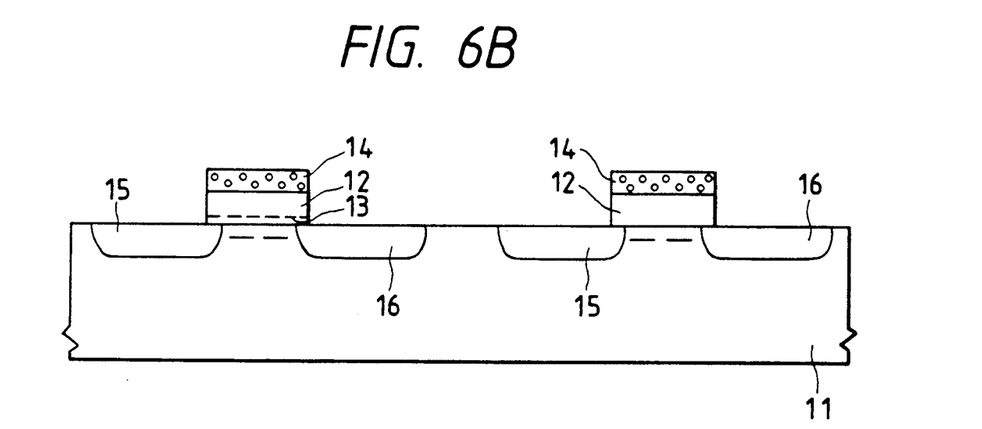

FIGS. 6A and 6B illustrate another example of the present invention. In FIGS. 6A and 6B, each numeral correspondingly denotes the constituent member shown in FIGS. 3A to 3C.

FIG. 6A shows an instance in which an Si+ion-implanted region 13 is selectively formed at part of a gate insulating film 12. In this instance, the threshold voltage $V_T$ of the MOS transistor is determined in a gate insulating film region in which no Si+ions are implanted, so that it becomes possible to more stably control the $V_T$ as suited for the MOS transistor.

Figure 7:
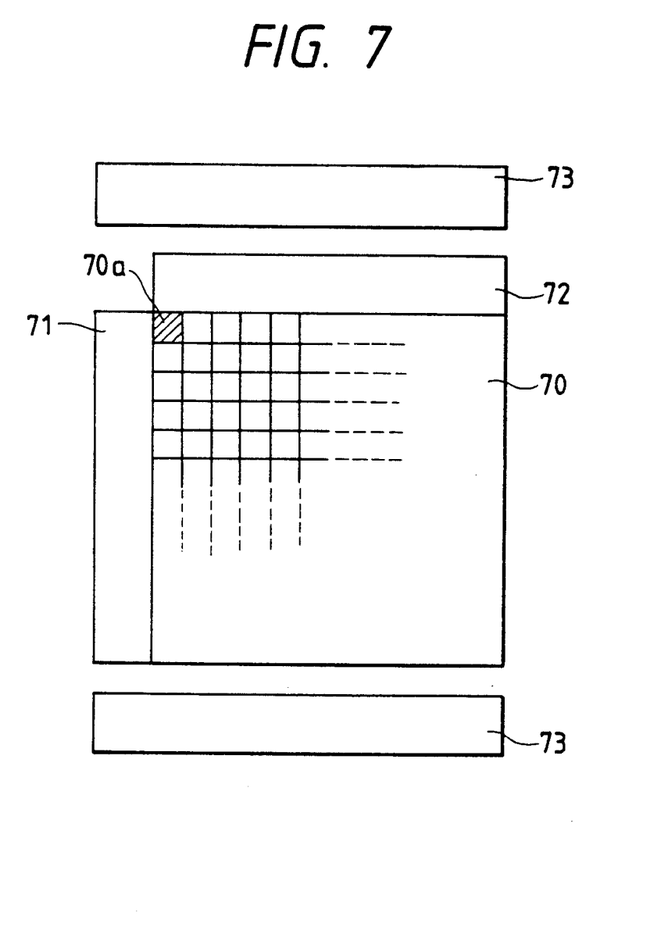
FIG. 7 illustrates the circuit constitution of a nonvolatile semiconductor memory according to the present invention.

FIG. 6B shows an example in which two types of MOS transistors comprised of a gate insulating film having an Si+ion-implanted region 13 and a gate insulating film having no Si+ion-implanted region 13 are integrally formed on the same Si substrate 11. More specifically, this is an example in which a nonvolatile MOS memory transistor having the nonvolatile memory effect and its peripheral control circuit for controlling the writing and erasing are integrated on the same Si substrate 11. FIG. 7 illustrate a more specific constitution thereof A plurality of nonvolatile MOS memory transistors 70a having the Si+ion-implanted region, thus having the nonvolatile memory effect, are disposed in array. A line decoder 71 and a string decoder 72, which select a particular device among the transistors 70a disposed in array, are disposed on the periphery of a memory array 70. A peripheral control circuit 73 contains a circuit for controlling the writing and erasing in the memory array 70. In this embodiment, the Si+ion-implanted region is selectively formed only in the nonvolatile MOS memory transistor and no Si+ion-implanted region is formed in the gate oxide film in respect of other decoders 71 and 72 and the peripheral control circuit 73, so that it is possible to achieve more accurate control of threshold voltage.

An example of a method of controlling an actual nonvolatile MOS memory transistor is described below. For example, at the time of writing, a high voltage of $+5$ V or more is applied to the Si+ion-implanted region so that a signal charge is written in the Si+ion-implanted region so as to give a high threshold voltage. At the time of erasing, a voltage of about $-5$V may be applied to the gate electrode so as to give a low threshold voltage. When a signal is read out, a read-out voltage with a voltage slightly higher than the threshold voltage of the nonvolatile MOS memory transistor in which no signal charge is accumulated is applied so as not to bring about a break of the signal charge stored in the Si+ion-implanted region. No drain current flows in the MOS memory transistor with a high threshold voltage, in which the signal charge is accumulated, but the drain current flows in the MOS memory transistor with a low threshold voltage, in which no signal charge is accumulated. The written signal can be read out depending on whether or not this drain current flows.

Thus, the nonvolatile MOS memory transistor according to the present invention can write/erase signals depending on the voltage applied to the gate electrode or the source/drain, and hence is useful as the so-called programable ROM (E$^2$PROM) capable of being electrically written and erased.

The memory retension characteristics of the nonvolatile MOS memory transistor obtained in the present experiment lasts for a longer period with an increase in the write voltage, and shows retension characteristics of from one month to several Years.

As having been described above, in the present invention, the ion belonging to the same Group IV in the periodic table as the ion of an Si substrate belongs is implanted in the gate insulating film. As a result, the hysteresis phenomenon that may not adversely affect the threshold voltage and also occurs at a gate voltage as low as $+5$ V has been established in the nonvolatile MOS memory transistor actually manufactured as an experiment. In the examples of the present invention, Si+ions are implanted. It, however, can be readily presumed that the same effect can be promised when Ge+ions, Sn+ions or Pb+ions are implanted.

Thus, the present invention can materialize a nonvolatile semiconductor memory by virtue of the simple operation that the Si+ions or the like are implanted in the gate insulating film. At the same time, MOS transistors used for a peripheral control circuit in which a more stable control of threshold voltage is required can be readily integrated on the same substrate by selectively forming the Si+ion-implanted region only in a nonvolatile semiconductor memory.

What is claimed is:

1. A method of preparing a nonvolatile semiconductor memory, comprising the steps of:
    forming a gate insulating film on a silicon semiconductor substrate;
    implanting a Group IV ion in said gate insulating film to form an ion-implanted region which is parallel to an interface between said silicon substrate and said gate insulating film, said ion-implanted region having a peak of impurity density of said implanted Group IV which is parallel to and located at said interface;
    forming a gate electrode, a source region, and a drain region.

2. A method of preparing a nonvolatile semiconductor memory according to claim 1, wherein an Si+ion is used as said Group IV ion, and said ion is implanted in a dose of not less than $10^{16}$ cm$^{-2}$ to form said ion-implanted region.

3. A method of preparing a nonvolatile semiconductor memory, comprising the steps of forming a gate insulating film on a silicon semiconductor substrate, implanting and Si+ion in said gate insulating film in a dose of not less than $10^{16}$ cm$^{-2}$ to form an ion-implanted region, and forming a gate electrode, a source region, and a drain region, said ion-implanted region and a horizontally adjacent non-implanted region are selectively formed in a portion of said gate insulating film between said source region and said drain region, with at least one end of the ion-implanted region extending from either said source region or said drain region, with the proviso that said ion-implanted region does not extend across said gate insulating film between said source region and said drain region.

* * * * *